US012672434B2

(12) United States Patent
Dai et al.

(10) Patent No.: US 12,672,434 B2
(45) Date of Patent: Jun. 30, 2026

(54) DISPLAY PANEL AND METHOD FOR MANUFACTURING SAME, AND DISPLAY DEVICE

(71) Applicant: BOE Technology Group Co., Ltd., Beijing (CN)

(72) Inventors: Qing Dai, Beijing (CN); Li Sun, Beijing (CN); Hongli Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/022,115

(22) PCT Filed: Jun. 29, 2022

(86) PCT No.: PCT/CN2022/102236
§ 371 (c)(1),
(2) Date: Feb. 17, 2023

(87) PCT Pub. No.: WO2024/000234
PCT Pub. Date: Jan. 4, 2024

(65) Prior Publication Data
US 2024/0276773 A1 Aug. 15, 2024

(51) Int. Cl.
*H10K 59/122* (2023.01)
*H10K 59/12* (2023.01)
*H10K 59/35* (2023.01)
*H10K 102/00* (2023.01)

(52) U.S. Cl.
CPC ....... *H10K 59/122* (2023.02); *H10K 59/1201* (2023.02); *H10K 59/353* (2023.02); *H10K 2102/351* (2023.02)

(58) Field of Classification Search
CPC ... H10K 59/122; H10K 59/353; H10K 59/352
See application file for complete search history.

(56) References Cited

U.S. PATENT DOCUMENTS

2002/0060518 A1* 5/2002 Duineveld ........... H10K 59/122
313/506

* cited by examiner

*Primary Examiner* — Julio J Maldonado
*Assistant Examiner* — Alexander Michael Miller
(74) *Attorney, Agent, or Firm* — IPro, PLLC

(57) ABSTRACT
Provided is a display panel. The display panel includes: a substrate; a plurality of pixels, disposed on a side of the substrate, wherein each of the plurality of pixels includes a plurality of sub-pixels of different colors; a pixel definition layer, disposed on the side of the substrate, wherein the pixel definition layer includes a plurality of first openings sequentially arranged in a first direction and a plurality of second openings disposed within the plurality of first openings and sequentially arranged in a second direction; a drainage layer, disposed on a side, distal from the substrate, of the pixel definition layer, wherein the drainage layer includes a plurality of drainage portions spaced apart from each other.

20 Claims, 9 Drawing Sheets

01

| | |
|---|---|
| Providing a substrate | 1301 |
| Forming a plurality of pixels on a side of the substrate | 1302 |
| Forming a pixel definition layer on the side of the substrate | 1303 |
| Forming a drainage layer on a side, distal from the substrate, of the pixel definition layer | 1304 |

DISPLAY PANEL AND METHOD FOR MANUFACTURING SAME, AND DISPLAY DEVICE

CROSS-REFERENCE TO RELATED APPLICATIONS

This application is a U.S. national stage of international application No. PCT/CN2022/102236, filed on Jun. 29, 2022, the disclosure of which is incorporated herein by reference in its entirety.

TECHNICAL FIELD

The present disclosure relates to the field of display technologies, and in particular, relates to a display panel and a method for manufacturing the same, and a display device.

BACKGROUND OF THE INVENTION

Organic light-emitting diode (OLED) display panels have been widely used in display devices of various types due to their advantages, such as self-luminescence, high luminescence efficiency, fast response speed, and the like.

SUMMARY OF THE INVENTION

Embodiments of the present disclosure provide a display panel and a method for manufacturing the same, and a display device. The technical solutions are as follows.

In some embodiments of the present disclosure, a display panel is provided. The display panel includes:

a substrate;

a plurality of pixels, disposed on a side of the substrate, wherein each of the plurality of pixels includes a plurality of sub-pixels of different colors;

a pixel definition layer, disposed on the side of the substrate, wherein the pixel definition layer includes a plurality of first openings sequentially arranged in a first direction and a plurality of second openings disposed within the plurality of first openings and sequentially arranged in a second direction, adjacent sub-pixels of a same color are disposed within a same first opening, adjacent sub-pixels of different colors are disposed within different first openings, and different sub-pixels in the adjacent sub-pixels of the same color are disposed within different second openings, the second direction being intersected with the first direction; and a drainage layer, disposed on a side, distal from the substrate, of the pixel definition layer, wherein the drainage layer includes a plurality of drainage portions spaced apart from each other, an orthogonal projection of each of the plurality of drainage portions on the substrate being overlapped with an orthogonal projection of the first opening on the substrate and being not overlapped with an orthogonal projection of the second opening on the substrate, wherein each of the plurality of drainage portions includes a plurality of drainage lines sequentially arranged in the first direction, one ends, distal from a target edge of the substrate, of the plurality of drainage lines are contacted to form a closed end of each of the plurality of drainage portions, and the other ends, proximal to the target edge of the substrate, of the plurality of drainage lines are spaced apart to form an open end of each of the plurality of drainage portions, the target edge being more proximal to the drainage portion relative to the other edges of the substrate.

In some embodiments, the pixel definition layer includes: a first pixel definition layer and a second pixel definition layer that are disposed on the side of the substrate, wherein the first pixel definition layer includes the plurality of first openings sequentially arranged in the first direction, the second pixel definition layer is disposed within the plurality of first openings and includes the plurality of second openings sequentially arranged in the second direction, and the orthogonal projection of each of the plurality of drainage portions on the substrate is within an orthogonal projection of the second pixel definition layer on the substrate.

In some embodiments, an overlapping region between the orthogonal projection of the second pixel definition layer on the substrate and the orthogonal projection of each of the plurality of drainage portions on the substrate is rectangular-shaped or trapezoidal-shaped, and the orthogonal projection of each of the plurality of drainage portions on the substrate is trapezoidal-shaped.

In some embodiments, a thickness of the first pixel definition layer is greater than a thickness of the second pixel definition layer;

a material of a side, distal from the substrate, of the first pixel definition layer includes a lyophobic material, and a material of the second pixel definition layer includes a lyophilic material; and the sub-pixel includes a pixel electrode, wherein in the second direction, the orthogonal projection of the second pixel definition layer on the substrate covers an orthogonal projection of an edge of the pixel electrode on the substrate.

In some embodiments, the substrate is rectangular-shaped, and includes a first sub-region and a second sub-region symmetrically arranged in a central axis, the central axis extending in the first direction; wherein in the plurality of drainage portions disposed within the first sub-region, the closed end of each of the plurality of drainage portions faces towards the second sub-region, and the open end of each of the plurality of drainage portions is distal from the second sub-region; and in the plurality of drainage portions disposed within the second sub-region, the closed end of each of the plurality of drainage portions faces towards the first sub-region, and the open end of each of the plurality of drainage portions is distal from the first sub-region.

In some embodiments, a cross section of the drainage line is I-shaped or T-shaped, and is perpendicular to the substrate.

In some embodiments, a thickness of the drainage line is greater than or equal to 0.3 μm.

In some embodiments, in the plurality of drainage lines in the drainage portion, an included angle between each two adjacent drainage lines is positively correlated with a line width of a side, distal from the substrate, of the drainage line.

In some embodiments, the included angle $\Phi$ between each two adjacent drainage lines meets: $\Phi < 0.12D + 0.3$, wherein D is the line width of the side, distal from the substrate, of the drainage line.

In some embodiments, the included angle between each two adjacent drainage lines (L1) ranges from 0.1° to 2°.

In some embodiments, the line width of the side, distal from the substrate (01), of the drainage line (L1) ranges from 2 μm to 20 μm.

In some embodiments, the drainage portion (041) includes 5 to 50 drainage lines (L1).

In some embodiments, a material of the drainage line (L1) includes at least one of titanium, aluminum, and a titanium-aluminum alloy; or a material of the drainage line (L1) includes an indium tin oxide.

In some embodiments of the present disclosure, a method for manufacturing a display panel is provided. The method for manufacturing the display panel is applicable to manufacturing the display panel according to above embodiments. The method includes:

providing a substrate;

forming a plurality of pixels on a side of the substrate, wherein each of the plurality of pixels includes a plurality of sub-pixels (021) of different colors;

forming a pixel definition layer on the side of the substrate, wherein the pixel definition layer includes a plurality of first openings sequentially arranged in a first direction and a plurality of second openings disposed within the plurality of first openings and sequentially arranged in a second direction, adjacent sub-pixels of a same color are disposed within a same first opening, adjacent sub-pixels of different colors are disposed within different first openings, and different sub-pixels in the adjacent sub-pixels of the same color are disposed within different second openings, the second direction being intersected with the first direction; and forming a drainage layer on a side, distal from the substrate, of the pixel definition layer, wherein the drainage layer includes a plurality of drainage portions spaced apart from each other, an orthogonal projection of each of the plurality of drainage portions on the substrate being overlapped with an orthogonal projection of the first opening on the substrate and being not overlapped with an orthogonal projection of the second opening on the substrate, wherein each of the plurality of drainage portions includes a plurality of drainage lines sequentially arranged in the first direction, one ends, distal from a target edge of the substrate, of the plurality of drainage lines are contacted to form a closed end of each of the plurality of drainage portions, and the other ends, proximal to the target edge of the substrate, of the plurality of drainage lines are spaced apart to form an open end of each of the plurality of drainage portions, the target edge being more proximal to the drainage portion relative to the other edges of the substrate.

In some embodiments of the present disclosure, a display device is provided. The display device includes: a power supply assembly, and the display panel according to above embodiments;

wherein the power supply assembly is connected to the display panel, and is configured to supply power to the display panel.

BRIEF DESCRIPTION OF DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

DETAILED DESCRIPTION

Figure 1:
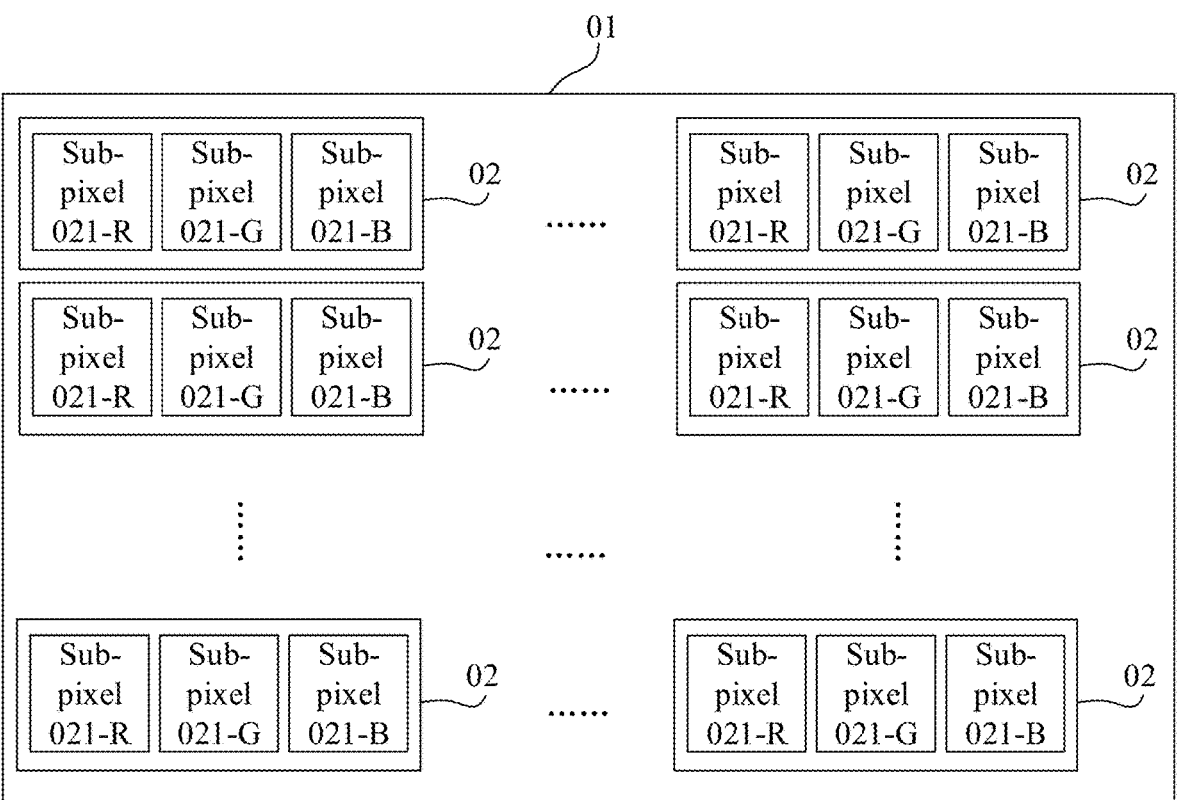
FIG. 1 is a schematic structural diagram of a display panel according to some embodiments of the present disclosure.

To make the objectives, technical solutions, and advantages of the present disclosure clearer, the embodiments of the present disclosure are further described in detail hereinafter with reference to the accompanying drawings.

In some practices, the OLED display panel generally includes a substrate, a plurality of pixels on a side of the substrate, and a pixel definition layer. The plurality of pixels include a plurality of sub-pixels of different colors, and the pixel definition layer includes a plurality of openings. The adjacent sub-pixels of a same color are disposed within a same opening, and the adjacent sub-pixels of different colors are disposed within different openings, that is, the adjacent sub-pixels of different colors are separated by the pixel definition layer. In addition, a function layer (for example, a luminescence material layer) included in the sub-pixel within the opening is generally formed through an ink-jet printing technology.

That is, relative positions of the plurality of pixels on the substrate are different. In addition, volumes of different pixels are different, that is, differences in volume between the pixels are present. The differences in volume are prone to display mura. On this basis, as recited above, the adjacent sub-pixels of the same color are defined in one opening by a pixel definition layer to connect the sub-pixels of the same color, such that the filling ink is uniformized through an ink-jet printing technology to improve the display mura caused by the differences in volume.

However, in drying process of the ink droplet, it is found that, as the relative positions of the plurality of pixels on the same substrate are different, the ink (i.e., solvent) printed through the ink-jet technology evaporates and dries faster at an edge (outside) of the substrate compared with a middle (inside) of the substrate, that is, a solidification speed is faster. As such, the solvent printed at the middle of the substrate is migrated towards the edge, that is, a solvent migration compensation current from inside to outside is generated. Eventually, a film layer formed at the edge of the substrate is thicker, that is, thicknesses of the film layer formed at different positions of the substrate are not uniform, and the uniformity is poor. Besides, on the premise that the display panel is divided into a display region and a non-display region, it is found in encapsulating process that, the ink is prone to random aggregation and migration due to a plurality of rib lines arranged in parallel in the non-display region, such that great inkblot is formed. The plurality of rib lines are configured to block water and oxygen intrusion, and function as encapsulating and protecting the display panel.

In conjunction with disadvantages of above completely connected sub-pixels, and the random bidirectional migration and aggregation, the embodiments of the present disclosure provide a new display panel, which improves the difference in thickness of the film layer formed at different positions through the ink-jet printing technology, such that the uniformity of the thicknesses of the film layer is ensured.

FIG. 1 is a schematic structural diagram of a display panel according to some embodiments of the present disclosure. As shown in FIG. 1, the display panel includes:

a substrate 01.

a plurality of pixels 02. The plurality of pixels 02 are disposed on a side of the substrate 01, and each of the plurality of pixels 02 includes a plurality of sub-pixels 021 of different colors.

For example, referring to FIG. 1, in the shown display panel, each pixel 02 includes the sub-pixels 021 of three colors, that is, a red sub-pixel 021-R, a green sub-pixel 021-G, and a blue sub-pixel 021-B. In some embodiments, each pixel 02 includes, but does not limited to, the sub-pixels 021 of three colors shown in FIG. 1, for example, the pixel 02 further includes a white sub-pixel.

Figure 2:
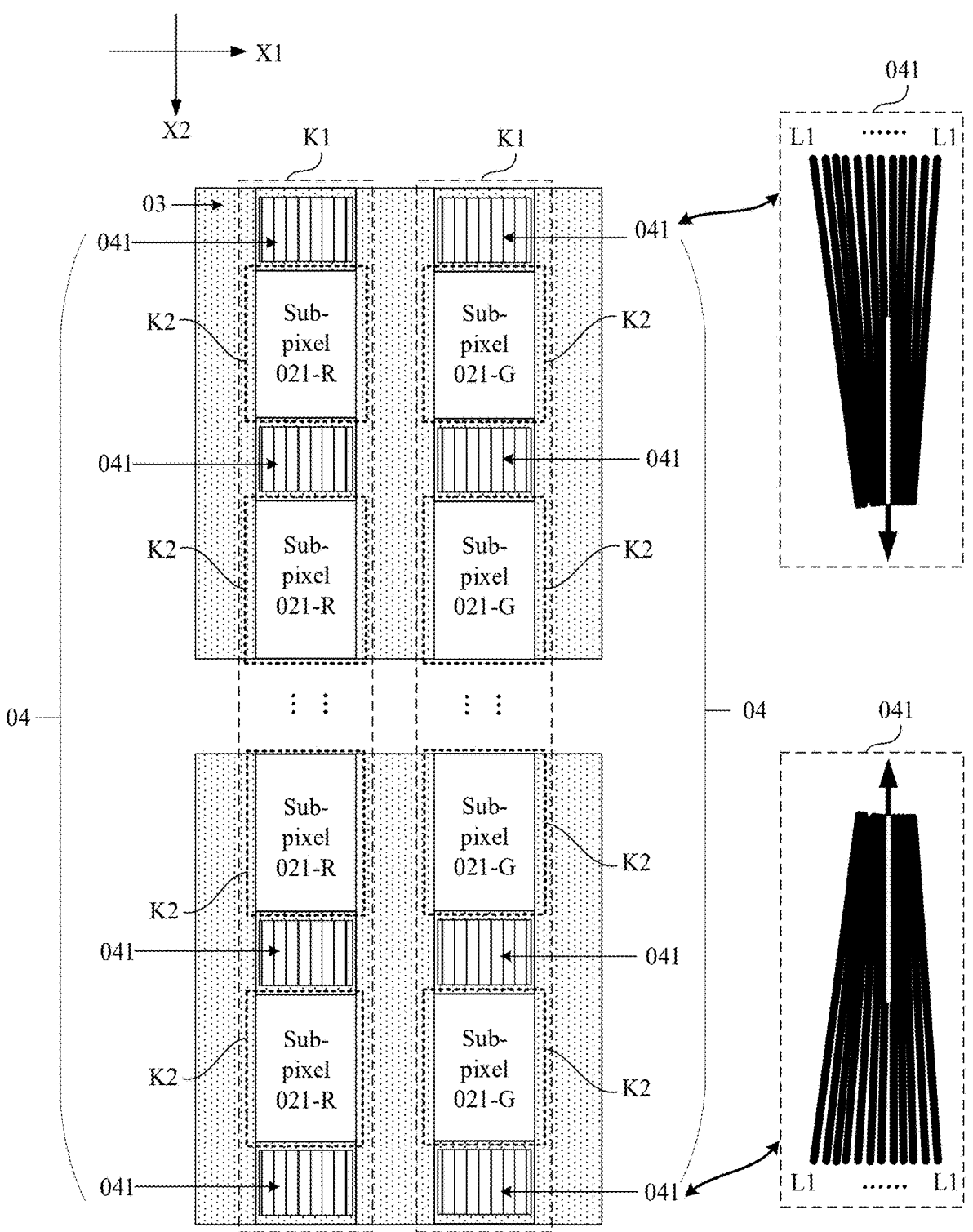
FIG. 2 is a locally schematic structural diagram of a display panel according to some embodiments of the present disclosure.

On the basis of FIG. 1, FIG. 2 shows a schematic structural diagram of another display panel according to some embodiments of the present disclosure. As shown in FIG. 2, the display panel according to the embodiments of the present disclosure further includes:

a pixel definition layer 03. The pixel definition layer 03 is disposed on the side of the substrate, and includes a plurality of first openings K1 sequentially arranged in a first direction X1 and a plurality of second openings K2 disposed within the plurality of first openings K1 and sequentially arranged in a second direction X2.

Adjacent sub-pixels 021 of a same color are disposed within a same first opening K1, adjacent sub-pixels 021 of different colors are disposed within different first openings K1, and different sub-pixels 021 in the adjacent sub-pixels 021 of the same color are disposed within different second openings K2. That is, the adjacent sub-pixels 021 of different colors are separated by the pixel definition layer 03, and the plurality of sub-pixels 021 are separated by the pixel definition layer 03.

In some embodiments, in conjunction with FIG. 1 and FIG. 2, the plurality of pixels 02 are arranged in an array, that is, arranged in rows and columns. On this basis, the adjacent sub-pixels 021 of the same color disposed within the same first opening K1 are the adjacent sub-pixels 021 of the same color sequentially arranged in a column direction, that is, the sub-pixels 021 of the same color in a same column, and thus, the sub-pixels 021 of the same color in the same column are longitudinally connectable. The adjacent sub-pixels 021 of different colors disposed within different first openings K1 are the adjacent sub-pixels 021 of different colors sequentially arranged in a row direction, that is, the sub-pixels 021 of different colors in a same row. FIG. 2 illustrates by taking the adjacent red sub-pixels 021-R in the same column being disposed within the same first opening K1, the adjacent green sub-pixels 021-G in the same column being disposed within the same first opening K1, and the red sub-pixels 021-R and the green sub-pixels 021-G being disposed within different first openings K1 as an example.

In addition, in conjunction with FIG. 2, it can be seen that the second direction X2 is intersected with the first direction X1. For example, the second direction X2 is perpendicular to the first direction X1. On this basis, the first direction X1 is regarded as the row direction, and the second direction X2 is regarded as the column direction.

Referring to FIG. 2, it can be seen that the display panel according to the embodiments of the present disclosure further includes: a drainage layer 04. The drainage layer 04 is disposed on a side, distal from the substrate 01, of the pixel definition layer 03, and includes a plurality of drainage portions 041 spaced apart from each other. An orthogonal projection of each of the plurality of drainage portions 041 on the substrate 01 is overlapped with an orthogonal projection of the first opening K1 on the substrate 01, and is not overlapped with an orthogonal projection of the second opening K2 on the substrate 01. That is, in conjunction with FIG. 2, each drainage portion 041 is disposed on a side, distal from the substrate 01, of a portion of the pixel definition layer 03 disposed within the first opening K1.

In addition, in conjunction with the locally enlarged diagram of the drainage portion 041 in FIG. 2, it can be seen that each of the plurality of drainage portions 041 includes a plurality of drainage lines L1 sequentially arranged in the first direction X1, one ends, distal from a target edge of the substrate 01, of the plurality of drainage lines L1 are contacted to form a closed end of the drainage portion 041, the other ends, proximal to the target edge of the substrate 01, of the plurality of drainage lines L1 are spaced apart to form an open end of the drainage portion 041, and the target edge is more proximal to the drainage portion 041 relative to the other edges of the substrate 01. That is, the target edge is an edge, most proximal to the drainage portion 041, of the edges included in the substrate 01. The closed end is also referred to as an aggregation end, and the open end is also referred to as a divergence end.

Based on the structure, the structure of the drainage portion 041 is referred to as a cluster line structure. For each drainage portion 041, the divergence end of the cluster line structure of the drainage portion 041 faces towards a most proximal edge of the drainage portion. For example, for the drainage portion 041 proximal to the upper edge in FIG. 2, the divergence end (that is, the open end) faces towards the upper edge. Correspondingly, the closed end faces towards the lower edge. For the drainage portion 041 proximal to the lower edge in FIG. 2, the divergence end (that is, the open end) faces towards the lower edge. Correspondingly, the closed end faces towards the upper edge.

Thus, by controlling the shape and line width of the drainage lines L1 in the drainage portion 041, and/or the included angle between each two adjacent drainage lines L1, the forces on the ink printed by the ink-jet are not uniform, such that the dynamic migration is achieved, and the migration direction is controllable. That is, a dynamic orientation migration is achieved. For example, the migration direction is controlled to be a direction indicated by an arrow in the locally enlarged diagram in FIG. 2. After verification of the experiments, in the case that the amount of the ink is great (generally the ink that has just been printed is much higher than the thickness of the pixel definition layer 03, generally 3 to 4 times the thickness of the pixel definition layer 03), the ink still has the capacity of the longitudinally connection capacity under restriction of the pixel definition layer 03, such that the volume uniformity is achieved. With the evaporation and drying of ink, a small amount of ink show a lyophobic state on the drainage portion 041 of the cluster line structure, such that the orientation migration is achieved. That is, the "connection" effect is achieved. By flexibly controlling the direction of the orientation migration, in the evaporation and drying process, the problem of thicker film layer of the edge formed by the migration compensation current of the ink from inside to outside due to the faster evaporation and drying speed of the ink printed on the edge is solved. That is, the uniformity of the thicknesses of the film layer formed at different positions is ensured.

It should be noted that as the drainage line L1 in the drainage portion 041 functions as blocking the ink, the drainage line L1 is equivalent to the rib line for blocking water and oxygen intrusion in the non-display region. The drainage line L1 is also referred to as the rib line. The rib line in the drainage portion 041 and the rib line in the non-display region are disposed on the same layer, that is, formed by the same material by the one-pattern process. As such, the process is simplified, and the cost is saved.

In summary, the display panel is provided in the embodiments of the present disclosure. The display panel includes a substrate, a pixel and a pixel definition layer disposed on a side of the substrate, and a drainage layer disposed on a side, distal from the substrate, of the pixel definition layer. The pixel definition layer defines adjacent sub-pixels of a same color within a same first opening, adjacent sub-pixels of different colors within different first openings, and different sub-pixels within different second openings. The drainage layer includes a plurality of drainage portions, and each drainage portion includes a plurality of drainage lines. As ends, distal from an edge, of the plurality of drainage lines form a closed end, and ends, proximal to the edge, of the plurality of drainage lines form an open end, the orientation migration of the ink printed by the inkjet from the edge to the middle is achieved in forming the function layer of the pixel. Furthermore, the migration compensation current from the middle to the edge due to the faster evaporation and drying speed of the ink printed on the edge is suppressed, and the film layer formed at the edge is avoided to be thicker. That is, in the display panel of the embodiments of the present disclosure, the uniformity of the thicknesses of the film layer formed at different positions of the substrate by the ink-jet printing technology is great.

Figure 3:
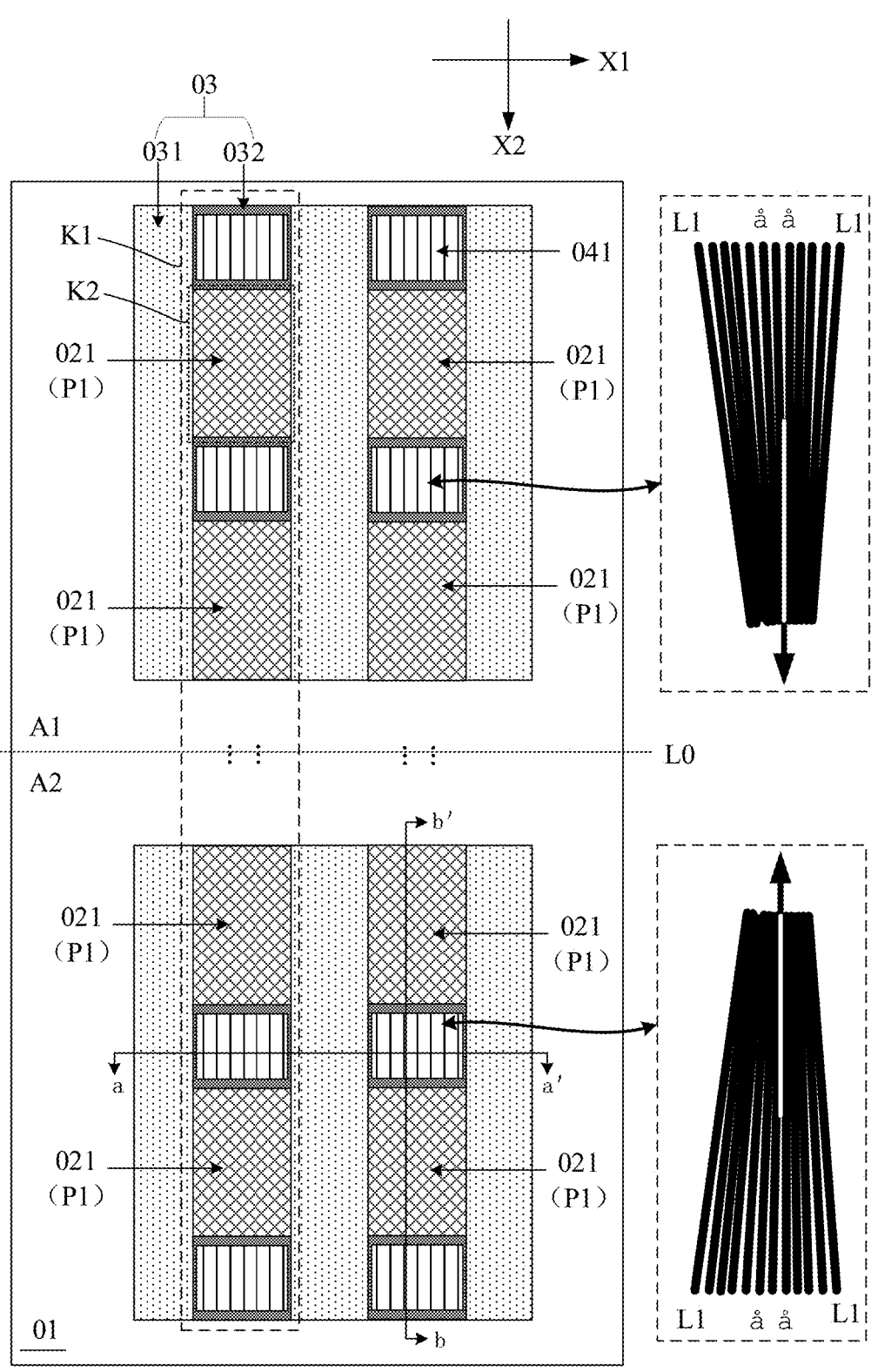
FIG. 3 is a locally schematic structural diagram of another display panel according to some embodiments of the present disclosure.
Figure 4:
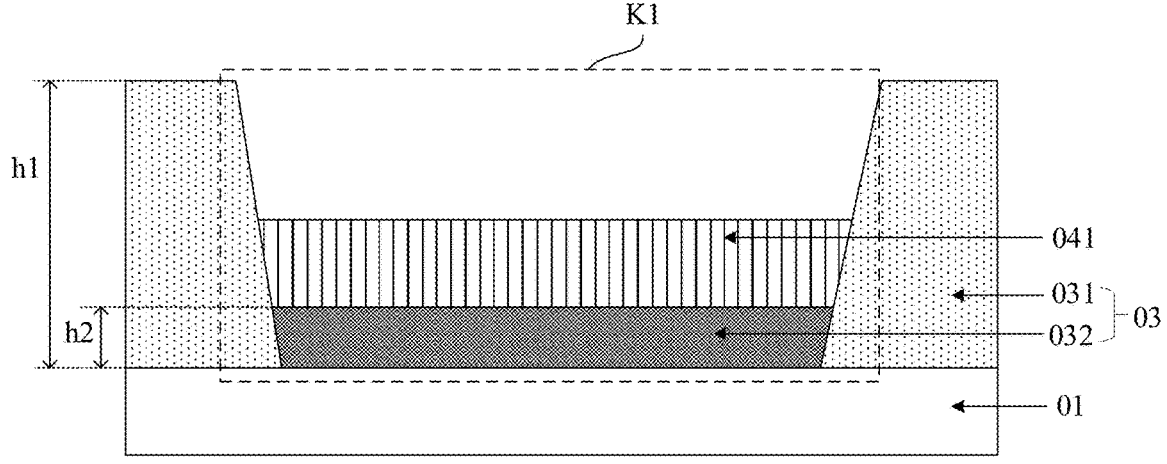
FIG. 4 is a sectional view of the structure shown in FIG. 3 in one direction.
Figure 5:
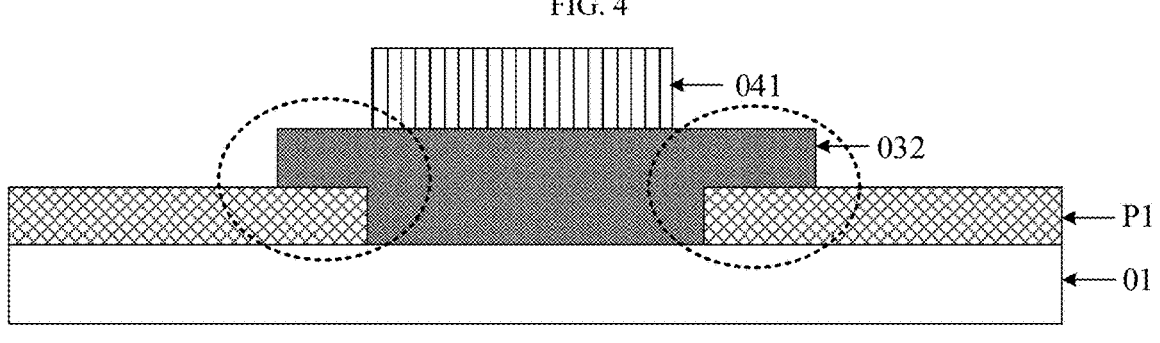
FIG. 5 is a sectional view of the structure shown in FIG. 3 in another direction.

FIG. 3 is a schematic structural diagram of another display panel according to some embodiments of the present disclosure, FIG. 4 is a sectional view of the structure as shown in FIG. 3 in the aa' direction, and FIG. 5 is a sectional view of the structure as shown in FIG. 3 in the bb' direction. Referring to FIGS. 3 to 5, it can be seen that the pixel definition layer 03 in the embodiments of the present disclosure includes: a first pixel definition layer 031 and a second pixel definition layer 032 disposed on the side of the substrate 01.

The first pixel definition layer 031 includes the plurality of first openings K1 sequentially arranged in the first direction X1. The second pixel definition layer 032 is disposed within the plurality of first openings K1, and includes the plurality of second openings K2 sequentially arranged in the second direction X2.

That is, the pixel definition layer 03 shown in FIG. 2 includes a pixel definition layer 031 with the first opening K1 and another pixel definition layer 032 with the second opening K2. The pixel definition layer completely connecting the adjacent sub-pixels 021 of the same color is the first pixel definition layer 031. In other words, the first pixel definition layer 031 is capable of separating the sub-pixels 021 of different colors, and connecting the sub-pixels 021 of the same color in the same column. The second pixel definition layer 032 is disposed within the plurality of first openings K1 of the first pixel definition layer 031, and separates the sub-pixels 021 of the same color. The drainage portions 041 included in the drainage layer 04 are disposed on the side, distal from the substrate 01, of the second pixel definition layer 032.

In addition, in conjunction with FIGS. 3 to 5, it can be seen that the orthogonal projection of each of the plurality of drainage portions 041 on the substrate 01 is within an orthogonal projection of the second pixel definition layer 032 on the substrate 01. That is, a length of each of the plurality of drainage portions 041 in the second direction X2 is less than a length of the second pixel definition layer 032 in the second direction X2. As such, the printed ink is avoided migrating greatly. In some embodiments, the orthogonal projection of each of the plurality of drainage portions 041 on the substrate 01 is exactly overlapped, that is, coincided with the orthogonal projection of the second pixel definition layer 032 on the substrate 01.

Based on the structure shown in FIGS. 3 to 5, it can be seen that the orthogonal projection of each of the plurality of drainage portions 041 on the substrate 01 is trapezoidal-shaped to achieve aggregation at one end and divergence at the other end, and the orthogonal projection of the second pixel definition layer 032 on the substrate 01 and the orthogonal projection of the drainage portion 041 on the substrate 01 have an overlapping region.

In some embodiments, referring to FIG. 3, the overlapping region is rectangular-shaped. Correspondingly, the orthogonal projection of the second pixel definition layer 032 on the substrate 01 is rectangular-shaped.

Figure 6:
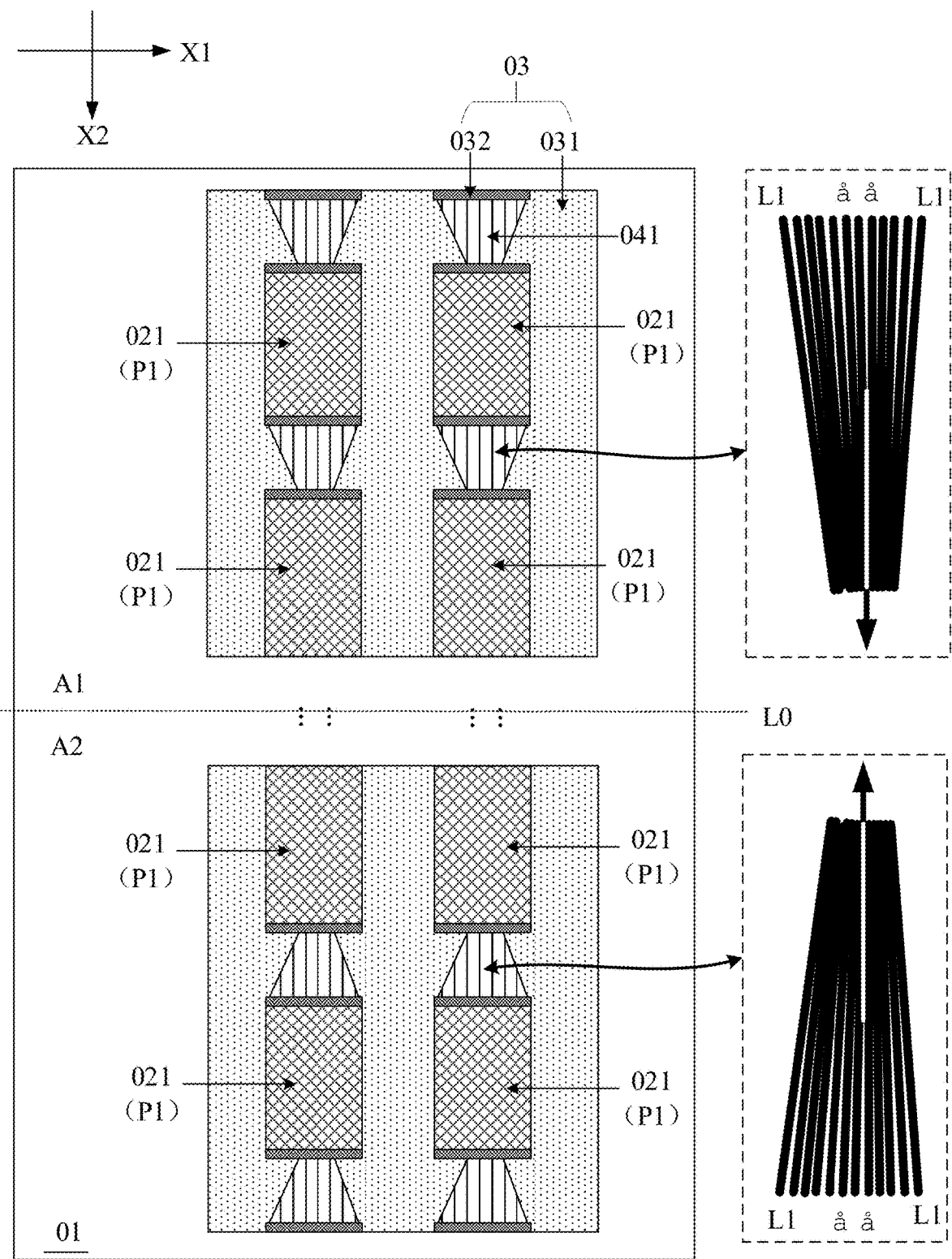
FIG. 6 is a locally schematic structural diagram of another display panel according to some embodiments of the present disclosure.

In some embodiments, referring to FIG. 6, the overlapping region is trapezoidal-shaped. Correspondingly, the orthogonal projection of the second pixel definition layer 032 on the substrate 01 is I-shaped. The I-shaped portion includes a top portion, a bottom portion, and a connection portion for connecting the top portion and the bottom portion. An orthogonal projection of the connection portion on the substrate 01 is in a trapezoidal-shaped. In addition to the I-shaped portion, other portion is disposed with the first pixel definition layer 031.

In some embodiments, referring to FIG. 6, the trapezoidal-shaped region of the overlapping region between the second pixel definition layer 032 and the drainage portion 041 and the trapezoidal-shaped region of drainage portion 041 is coincided, that is, the sizes are equal, and the positions are exactly the same. As such, the migration direction of the ink is greatly controlled, and the drainage is great.

In some embodiments, the overlapping region between the second pixel definition layer 032 and the drainage portion 041 is in other shape, such as, an irregular shape.

It can be seen referring to FIG. 4 that, a thickness h1 of the first pixel definition layer 031 is greater than a thickness h2 of the second pixel definition layer 032. That is, the first pixel definition layer 031 is higher than the second pixel definition layer 032. A direction of the thickness of the first pixel definition layer 031 and a direction of the thickness of the second pixel definition layer 032 are perpendicular to a direction of the substrate 01, that is, the thickness h1 and the thickness h2 are perpendicular to the thickness of the substrate 01.

In some embodiments, the thickness of the first pixel definition layer 031 ranges from 1 micrometer ($\mu$m) to 2 $\mu$m. That is, the thickness h1 of the first pixel definition layer 031 is greater than or equal to 1 $\mu$m, and is less than or equal to 2 $\mu$m. For example, the thickness of the first pixel definition layer 031 is 1.5 $\mu$m. The thickness of the second pixel definition layer 032 ranges from 0.3 $\mu$m to 0.5 $\mu$m. That is, the thickness h2 of the second pixel definition layer 032 is greater than or equal to 0.3 $\mu$m, and is less than or equal to 0.5 $\mu$m. For example, the thickness of the second pixel definition layer 032 is 0.4 $\mu$m.

A material of a side, distal from the substrate, of the first pixel definition layer 031 includes a lyophobic material. That is, the first pixel definition layer 031 has a top-lyophobic property. A material of the second pixel definition layer 032 includes a lyophilic material. That is, the second pixel definition layer 032 has a lyophilic property. Both the first pixel definition layer 031 and the second pixel definition layer 032 are configured to define and accommodate the printed ink.

The lyophobic property refers to a property of producing repulsive force on liquid. A lyophilic property refers to a property of attracting the liquid, so as to be infiltrated by the liquid. The liquid may be the ink in the embodiments of the present disclosure.

In some embodiments, in conjunction with FIG. 3 and FIG. 5, it can be seen that each sub-pixel 021 in the embodiments of the present disclosure includes a pixel electrode P1. In addition, in the second direction X2, the orthogonal projection of the second pixel definition layer 032 on the substrate 01 covers an orthogonal projection of an edge of the pixel electrode P1 on the substrate 01. That is, the second pixel definition layer 032 covers a cross section of the edge of the pixel electrode P1 (referring to the portion marked by the circuit in FIG. 5). As such, the electric leakage of pixel electrode P1 is avoided, and a product yield is ensured.

Figure 7:
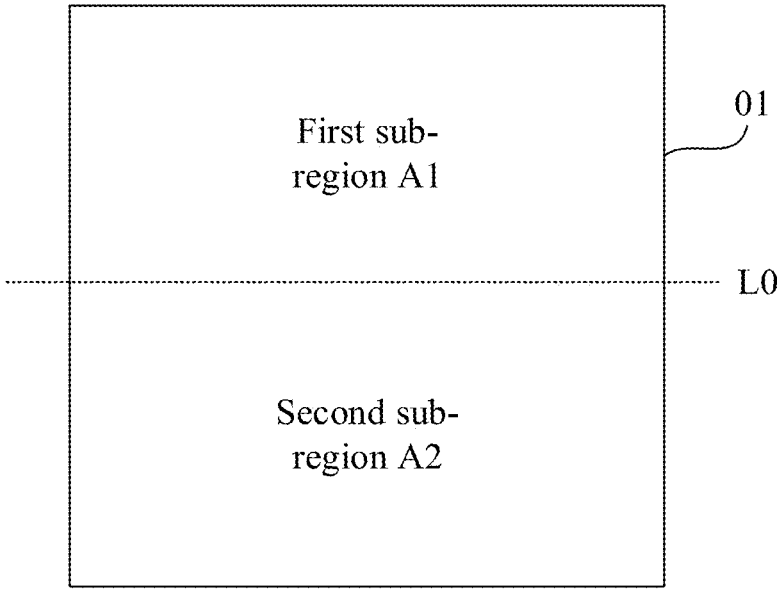
FIG. 7 is a schematic of sub-regions of a substrate of a display panel according to some embodiments of the present disclosure.

In some embodiments, FIG. 7 is a schematic structural diagram of another display panel according to some embodiments of the present disclosure. As shown in FIG. 7, the substrate 01 of the display panel is rectangular-shaped, and the substrate 01 includes a first sub-region A1 and a second sub-region A2 symmetrically arranged in a central axis L0. The central axis L0 extends in the first direction X1. The symmetrical arrangement refers to that the first sub-region A1 and the second sub-region A are coincided upon being folded in the central axis L0, that is, the central axis L0 is in a middle of the substrate 01.

On this basis, in conjunction with the locally enlarged diagram of the structures in FIG. 3 and FIG. 6, it can be seen that in the plurality of drainage portions 041 in the first sub-region A1, the closed end of each drainage portion 041 faces towards the second sub-region A2, the open end of each drainage portion 041 is distal from the second sub-region A2. In addition, in the plurality of drainage portions 041 in the second sub-region A2, the closed end of each drainage portion 041 faces towards the first sub-region A1, and the open end of each drainage portion 041 is distal from the first sub-region A1. That is, the directions of the closed ends and the open ends of the drainage portions 041 in the first sub-region A1 and the directions of the closed ends and the open ends of the drainage portions 041 in the second sub-region A2 are exactly opposite to each other.

Thus, the drainage layer 04 is divided into an upper half portion with an upward opening and a lower half portion with a downward opening. The upper half portion is disposed in the first sub-region A1, and the divergence end faces towards the upper edge. The lower half portion is disposed in the second sub-region A2, and the divergence end faces towards the lower edge. As such, the orientation migration direction drained by the drainage portions 041 in the upper half portion is controlled to be the downward direction indicated by the arrow shown in drawings, so as to efficiently suppress the migration compensation current from the middle to the upper edge. The orientation migration direction drained by the drainage portions 041 in the lower half portion is controlled to be the upward direction indicated by the arrow shown in drawings, so as to efficiently suppress the migration compensation current from the middle to the lower edge. In some embodiments, the substrate 01 is in other shape, such as, a trapezoid, a triangle, or a circle.

Figure 8:
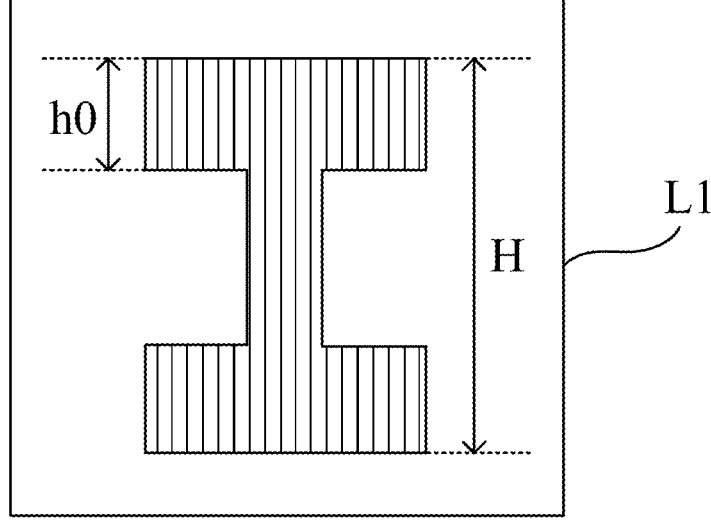
FIG. 8 is a schematic sectional view of a drainage line according to some embodiments of the present disclosure.

In some embodiments, referring to FIG. 8, the cross section of each drainage line L1 in the embodiments of the present disclosure is I-shaped. As recited in above embodiments, the I-shaped portion refers to a shape including a top portion, a bottom portion, and a connection portion for connecting the top portion and the bottom portion. In some embodiments, referring to FIG. 9, the cross section of each drainage line L1 in the embodiments of the present disclosure is T-shaped. Comparing with the I-shaped portion, the T-shaped portion refers to a shape including a top portion and a connection portion, but not including a bottom portion. The cross section of the drainage line L1 is perpendicular to the substrate 01. Correspondingly, the cross section is also referred to as a transverse section.

Figure 10:
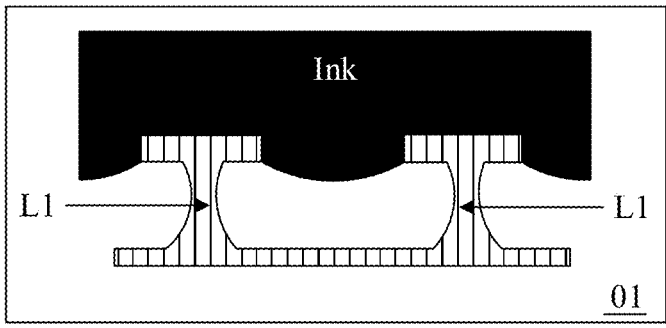
FIG. 10 is an equivalent diagram of printing ink according to some embodiments of the present disclosure.

On this basis, by taking the cross section of the drainage line L1 being I-shaped as an example, it can be seen in conjunction with FIG. 10 that a great interspace is present between each two adjacent drainage lines L1. The air is encapsulated into the interspace. Under the action of the encapsulated air, the ink printed on the side, distal from substrate 01, of the drainage portion 041 cannot migrate to the side, proximal to the substrate 01, of the drainage portion 041, that is, the bottom of the drainage line L1, so as to show a "lyophobic" phenomena in a cassie state. In the second direction X2, the included angle is present between the adjacent drainage lines L1, such that the forces on the ink below the upper surface of the drainage portion 041 are not uniform, and the dynamic migration is achieved.

Figure 9:
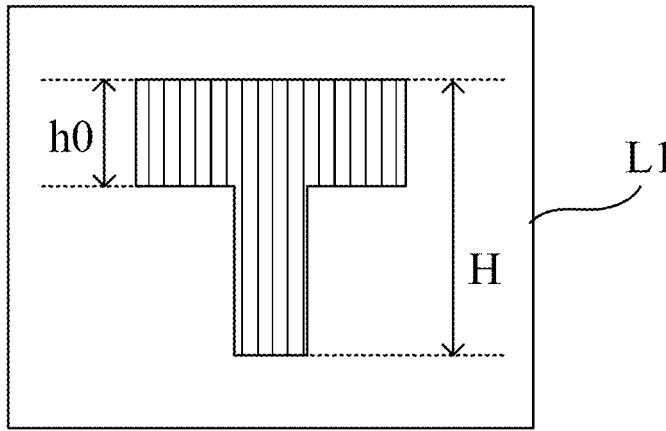
FIG. 9 is a schematic sectional view of another drainage line according to some embodiments of the present disclosure.

In some embodiments, in conjunction with FIG. 8 and FIG. 9, it can be seen that in the embodiments of the present disclosure, a thickness H of the drainage line L1 is greater than or equal to 0.3 $\mu$m. The thickness H is a whole thickness, and thus, the thickness H of the drainage line L1 is 0.7 $\mu$m. A thickness h0 of the top portion of the side, distal from the substrate 01, of the drainage line L1 ranges from 0.1 $\mu$m to 0.3 $\mu$m. That is, the thickness h0 of the top portion is greater than or equal to 0.1 $\mu$m, and is less than or equal to 0.3 $\mu$m. The thickness h0 of the top portion is 0.2 $\mu$m. By disposing above thickness, the manufacturing cost is saved, the manufacturing difficulty is simplified, and the formed display panel is thinner on the premise that the orientation migration of the ink is achieved.

Figure 11:
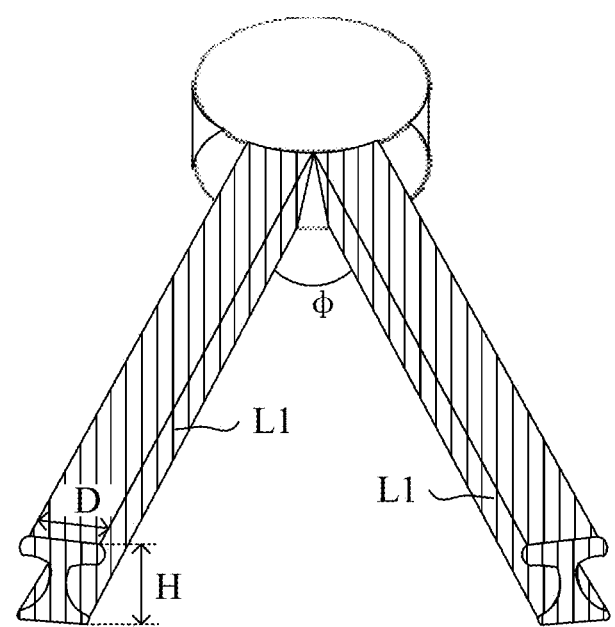
FIG. 11 is a schematic structural diagram of two adjacent drainage lines according to some embodiments of the present disclosure.

In some embodiments, FIG. 11 shows a schematic structural diagram of two adjacent drainage lines L1 by taking the cross section of the drainage line L1 being I-shaped as an example. The included angle Φ between two adjacent drainage lines L1 and the line width D (that is, the width of the top portion) of the side, distal from the substrate 01, of the drainage line L1 are marked, and the thickness H is further marked. It is found that the migration direction is controllable flexibly and reliably by controlling D and Φ.

In some embodiments of the present disclosure, in the plurality of drainage lines L1 in the drainage portion 041, the included angle Φ between each two adjacent drainage lines L1 is disposed to be positively correlated with the line width D of the side, distal from the substrate 01, of the drainage line L1. That is, the greater the D, the greater the Φ. The less the D, the less the Φ.

In some embodiments, upon several experiments, it can be found that in the case that the included angle Φ between each two adjacent drainage lines L1 is set to meet: Φ<0.12D+0.3, the effect of orientation migration is great, and the migration compensation current is efficiently suppressed.

In some embodiments, in conjunction with FIG. 11, the included angle Φ between each two adjacent drainage lines L1 ranges from 0.1 degree (°) to 2°. That is, the included angle Φ between each two adjacent drainage lines L1 is greater than or equal to 0.1°, and is less than or equal to 2°. In some embodiments, the included angle Φ between each two adjacent drainage lines L1 is 0.1°, 0.2°, 0.3°, 0.5°, 0.8°, 1°, 1.2°, 1.3°, 1.5°, 1.8°, or 2°.

It is found in tests that in the case that the included angle Φ between each two adjacent drainage lines L1 is greater than 2°, that is, the space between two adjacent drainage lines L1 is greater, it is not prone to the "lyophobic" phenomena in above embodiments, that is, the ink printed on the side, distal from the substrate 01, of the drainage portion 041 is not held. Once the ink is dropped into the bottom portion of the drainage portion 041, the ink cannot migrate. Thus, by disposing the included angle Φ between each two adjacent drainage lines L1 meeting above ranges, the orientation migration is achieved on the premises that the ink is efficiently held.

In some embodiments, in conjunction with FIG. 11, the line width D of the side, distal from the substrate 01, of each drainage line L1 ranges from 2 μm to 20 μm. That is, the width D of the top portion of each drainage line L1 is greater than or equal to 2 μm, and is less than or equal to 20 μm. In some embodiments, the width D of the top portion of each drainage line L1 is 5 μm, 6 μm, 8 μm, 10 μm, 12 μm, 15 μm, 18 μm, or 20 μm. Upon tests, the drainage is facilitated, and the orientation migration is achieved by disposing the width D of the top portion of the drainage line L1 meeting above ranges.

In some embodiments, each drainage portion 041 in the embodiments of the present disclosure includes 5 to 50 drainage lines L1. In some embodiments, each drainage portion 041 includes 5, 8, 10, 15, 20, 25, 30, 35, 40, 45, or 50 drainage lines L1. Upon tests, by disposing the drainage portion 041 including the plurality of drainage lines L1 of above number range, the control of the orientation migration of the ink is further achieved on the premise that the manufacturing process is simplified and the cost is avoided to be greater.

In some embodiments, the material of the drainage line L1 in the embodiments of the present disclosure includes an indium tin oxide (ITO), for example, the same material ITO/Ag/ITO as the pixel anode layer.

Figure 12:
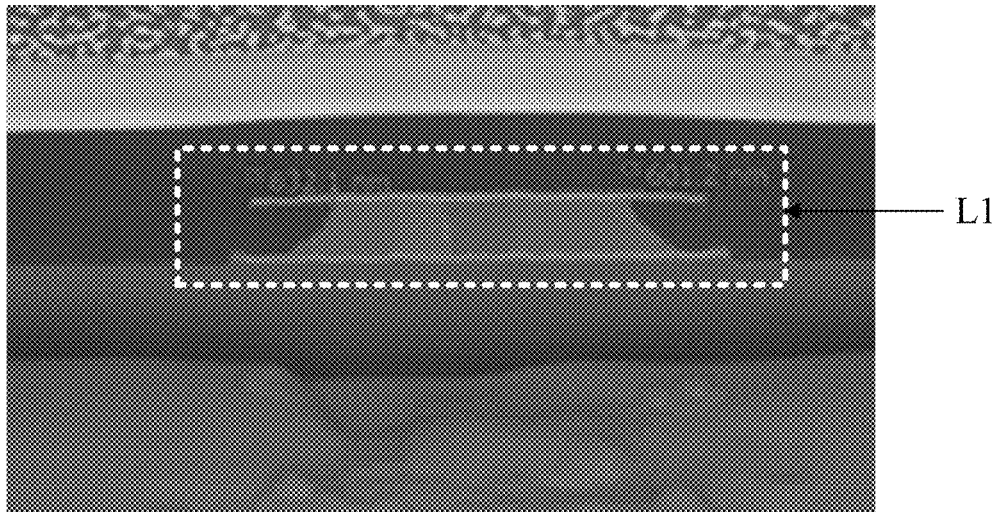
FIG. 12 is a layer equivalent diagram of a drainage line in a display panel according to some embodiments of the present disclosure.

In some embodiments, the material of the drainage line L1 includes at least one of titanium (Ti), aluminum (Al), and a titanium-aluminum alloy. It can be seen in conjunction with the actual effect shown in FIG. 12 that the drainage line L1 with the I-shaped cross section includes a top portion, a bottom portion, and a connection portion for connecting the top portion and the bottom portion. The materials of the top portion and the bottom portion are Ti, and the material of the connection portion is Al. That is, the drainage line L1 is composed of Ti, Al, and Ti. In addition, a width of a protrusion of the top portion of the drainage line L1 relative to the connection portion is further illustratively marked in FIG. 12. The width of the protrusion on the left side is 632.1 nm, and the width of the protrusion on the right side is 601.2 nm.

In some embodiments of the present disclosure, the lengths, the thicknesses, the shapes, the widths of the top portion, and/or the materials of the plurality of drainage lines L1 in each drainage portion 041 are the same or different. Similarly, above parameters and numbers of the plurality of drainage lines L1 in different drainage portions 041 are the same or different. The difference is on the premise that the description in the above embodiments is satisfied.

In summary, the display panel is provided in the embodiments of the present disclosure. The display panel includes a substrate, a pixel and a pixel definition layer disposed on a side of the substrate, and a drainage layer disposed on a side, distal from the substrate, of the pixel definition layer. The pixel definition layer defines adjacent sub-pixels of a same color within a same first opening, adjacent sub-pixels of different colors within different first openings, and different sub-pixels within different second openings. The drainage layer includes a plurality of drainage portions, and each drainage portion includes a plurality of drainage lines. As ends, distal from an edge, of the plurality of drainage lines form a closed end, and ends, proximal to the edge, of the plurality of drainage lines form an open end, the orientation migration of the ink printed by the inkjet from the edge to the middle is achieved in forming the function layer of the pixel. Furthermore, the migration compensation current from the middle to the edge due to the faster evaporation and drying speed of the ink printed on the edge is suppressed, and the film layer formed at the edge is avoided to be thicker. That is, in the display panel of the embodiments of the present disclosure, the uniformity of the thicknesses of the film layer formed at different positions of the substrate by the ink-jet printing technology is great.

Figure 13:
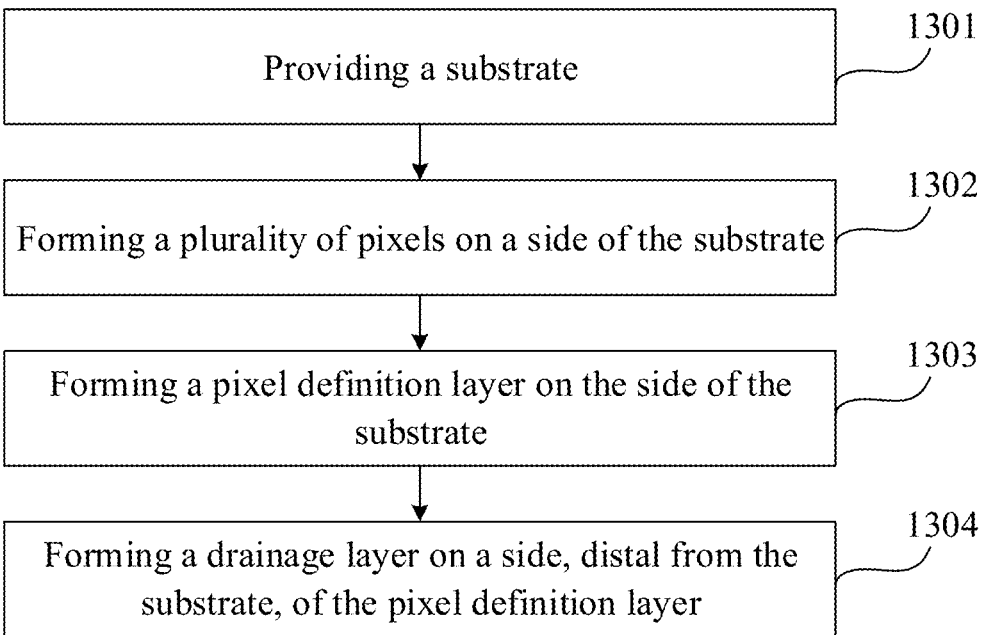
FIG. 13 is a flow chart of a method for manufacturing the display panel according to some embodiments of the present disclosure.

FIG. 13 is a flow chart of a method for manufacturing the display panel according to some embodiments of the present disclosure. As shown in FIG. 13, the method includes the following processes.

In S1301, a substrate is provided.

In some embodiments, in conjunction with FIG. 1, the provided substrate is a glass substrate or a flexible substrate.

In S1302, a plurality of pixels are formed on a side of the substrate.

Each of the plurality of formed pixels includes a plurality of sub-pixels 021 of different colors. For example, in conjunction with FIG. 1, each formed pixel includes 02 includes the sub-pixels of three different colors, that is, the red sub-pixel 021-R, the green sub-pixel 021-G, and the blue sub-pixel 021-B.

In some embodiments, the plurality of pixels are formed by the one-pattern process using a mask plate. The one-pattern process includes photoresist coating, exposing, developing, etching, photoresist removing, and the like.

In S1303, a pixel definition layer is formed on the side of the substrate.

In some embodiments, the pixel definition layer is formed by the one-pattern process using the mask plate. In addition, referring to FIG. 2, the formed pixel definition layer 03 includes a plurality of first openings K1 sequentially arranged in a first direction X1 and a plurality of second openings K2 disposed within the plurality of first openings K1 and sequentially arranged in a second direction X2. Adjacent sub-pixels 021 of a same color are disposed within a same first opening K1, adjacent sub-pixels 021 of different colors are disposed within different first openings K1, and different sub-pixels in the adjacent sub-pixels 021 of the same color are disposed within different second openings K2. The second direction X2 is intersected with the first direction X1.

In S1304, a drainage layer is formed on a side, distal from the substrate, of the pixel definition layer.

In some embodiments, the drainage layer is formed by the one-pattern process using the mask plate. In addition, referring to FIG. 2 and FIG. 3, it can be seen that the formed drainage layer 04 includes a plurality of drainage portions 041 spaced apart from each other, and an orthogonal projection of each of the plurality of drainage portions 041 on the substrate 01 is overlapped with an orthogonal projection of the first opening K1 on the substrate 01 and is not overlapped with an orthogonal projection of the second opening K2 on the substrate 01.

Each of the plurality of drainage portions 041 includes a plurality of drainage lines L1 sequentially arranged in the first direction X1, one ends, distal from a target edge of the substrate 01, of the plurality of drainage lines L1 are contacted to form a closed end of the drainage portion 041, and the other ends, proximal to the target edge of the substrate 01, of the plurality of drainage lines L1 are spaced apart to form an open end of the drainage portion 041. The target edge is more proximal to the drainage portion 041 relative to the other edges of the substrate 01.

In some embodiments, referring to FIGS. 3 to 6, it can be seen that the formed pixel definition layer 03 includes: a first pixel definition layer 031 and a second pixel definition layer 032 disposed on the side of the substrate 01.

The first pixel definition layer 031 includes the plurality of first openings K1 sequentially arranged in the first direction X1. The second pixel definition layer 032 is disposed within the plurality of first openings K1, and includes the plurality of second openings K2 sequentially arranged in the second direction X2. The orthogonal projection of each of the plurality of drainage portions 041 on the substrate 01 is within an orthogonal projection of the second pixel definition layer 032 on the substrate 01. The orthogonal projection of the formed second pixel definition layer 032 on the substrate 01 and the orthogonal projection of the drainage portion 041 on the substrate 01 have an overlapping region.

In some embodiments, referring to FIG. 3, the overlapping region is rectangular-shaped. Or, referring to FIG. 6, the overlapping region is trapezoidal-shaped. The orthogonal projection of the formed drainage portion 041 on the substrate 01 is trapezoidal-shaped.

In some embodiments, it can be seen referring to FIGS. 3 to 5 that, a thickness h1 of the formed first pixel definition layer 031 is greater than a thickness h2 of the second pixel definition layer 032. A material of a side, distal from the substrate, of the first pixel definition layer 031 includes a lyophobic material. A material of the second pixel definition layer 032 includes a lyophilic material. The formed sub-pixel 021 includes a pixel electrode P1. In addition, in the second direction X2, the orthogonal projection of the formed second pixel definition layer 032 on the substrate 01 covers an orthogonal projection of an edge of the pixel electrode P1 on the substrate 01.

In some embodiments, referring to FIG. 7, the substrate 01 is rectangular-shaped, and the substrate 01 includes a first sub-region A1 and a second sub-region A2 symmetrically arranged in a central axis L0. The central axis L0 extends in the first direction X1. On this basis, in conjunction with FIG. 3 and FIG. 6, it can be seen that in the plurality of drainage portions 041 in the first sub-region A1, the closed end of each drainage portion 041 faces towards the second sub-region A2, the open end of each drainage portion 041 is distal from the second sub-region A2. In addition, in the plurality of drainage portions 041 in the second sub-region A2, the closed end of each drainage portion 041 faces towards the first sub-region A1, the open end of each drainage portion 041 is distal from the first sub-region A1.

In some embodiments, referring to FIG. 8 and FIG. 9, the cross section of the formed drainage line L1 is I-shaped T-shaped. The cross section of the drainage line L1 is perpendicular to the substrate 01. For example, the specific "I" or "T" shape is formed by wet etching process, and the cost is less.

In some embodiments, in conjunction with FIG. 8, a thickness H of the formed drainage line L1 is greater than or equal to 0.3 μm.

In some embodiments, in conjunction with FIG. 11, in the plurality of drainage lines L1 in the formed drainage portion 041, the included angle between each two adjacent drainage lines L1 is positively correlated with the line width of the side, distal from the substrate 01, of the drainage line L1.

For example, the included angle Φ between each two adjacent formed drainage lines L1 meets: Φ<0.12D+0.3. D is the line width of the side, distal from the substrate 01, of the drainage line L1.

In some embodiments, in conjunction with FIG. 11, the included angle Φ between each two adjacent drainage lines L1 ranges from 0.1° to 2°.

In some embodiments, in conjunction with FIG. 11, the line width D of the side, distal from the substrate 01, of the drainage line L1 ranges from 2 μm to 20 μm.

In some embodiments, each drainage portion 041 includes 5 to 50 drainage lines L1.

In some embodiments, the material of the drainage line L1 includes at least one of titanium, aluminum, and a titanium-aluminum alloy. That is, the drainage line L1 is formed by titanium, aluminum, and/or the titanium-aluminum alloy. In some embodiments, the material of the drainage line L1 includes an indium tin oxide. That is, the drainage line L1 is formed by the indium tin oxide, such as the same material as the pixel anode layer, for example, ITO/Ag/ITO, or a material containing $SiO_2$, provided that the I-shaped structure can be formed, which is not limited in the embodiments of the present disclosure.

In summary, a method for manufacturing a display panel is provided in the embodiments of the present disclosure. in the method, a pixel and a pixel definition layer is formed on a side of the substrate, and a drainage layer is formed on a side, distal from the substrate, of the pixel definition layer. The formed pixel definition layer defines adjacent sub-pixels of a same color within a same first opening, adjacent sub-pixels of different colors within different first openings, and different sub-pixels within different second openings. The formed drainage layer includes a plurality of drainage portions, and each drainage portion includes a plurality of drainage lines. As ends, distal from an edge, of the plurality of drainage lines form a closed end, and ends, proximal to the edge, of the plurality of drainage lines form an open end, the orientation migration of the ink printed by the inkjet from the edge to the middle is achieved in forming the function layer of the pixel. Furthermore, the migration compensation current from the middle to the edge due to the faster evaporation and drying speed of the ink printed on the edge is suppressed, and the film layer formed at the edge is avoided to be thicker. That is, by the method for manufacturing the display panel in the embodiments of the present disclosure, the uniformity of the thicknesses of the film layer formed at different positions of the substrate by the ink-jet printing technology is great.

Figure 14:
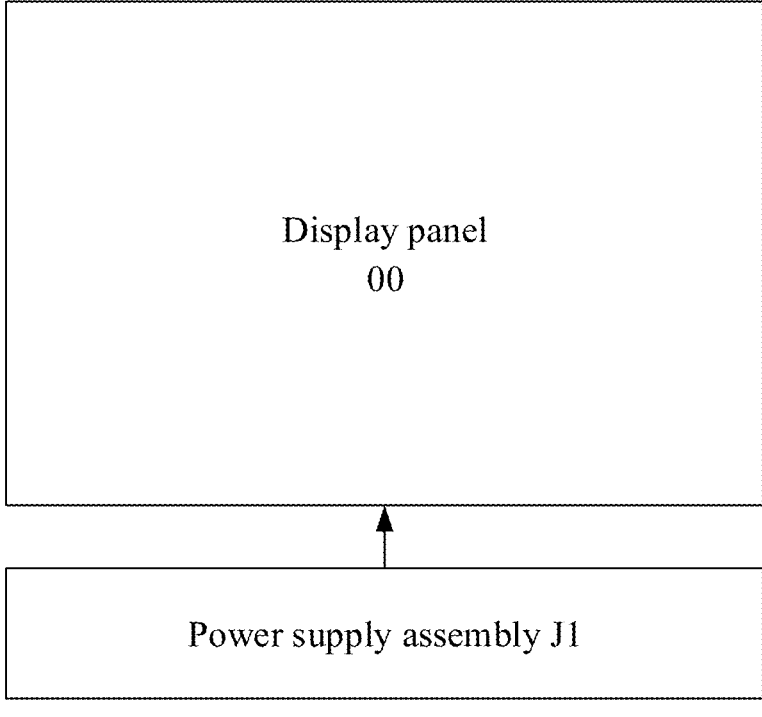
FIG. 14 is a schematic structural diagram of a display device according to some embodiments of the present disclosure.

FIG. 14 is a schematic structural diagram of a display device according to some embodiments of the present disclosure. As shown in FIG. 14, the display device includes: a power supply assembly J1, and the display panel 00 shown in above drawings.

The power supply assembly J1 is connected to the display panel 00, and is configured to supply power to the display panel 00.

In some embodiments, the display device is an OLED device, a mobile phone, a tablet computer, a television, a monitor, or any product or component with display function.

It should be noted that in the accompanying drawings, for clarity of the illustration, the dimension of the layers and regions may be scaled up. It should be understood that when an element or layer is described as being "on" another element or layer, the described element or layer may be directly located on other elements or layers, or an intermediate layer may exist. In addition, it should be understood that when an element or layer is described as being "under" another element or layer, the described element or layer may be directly located under other elements, or more than one intermediate layer or element may exist. In addition, it should be further understood that when a layer or element is described as being arranged "between" two layers or elements, the described layer or element may be the only layer between the two layers or elements, or more than one intermediate layer or element may exist. In the whole disclosure, like reference numerals indicate like elements.

The terms used in the embodiments of the present disclosure are intended only to explain the embodiments of the present disclosure, and are not intended to limit the present disclosure. Unless otherwise defined, the technical or scientific terms used in the embodiments of the present disclosure shall have the general meaning understood by those of ordinary skill in the art to which the present disclosure belongs.

In the embodiments of the present disclosure, the terms "first" and "second" are used to descriptive purposes, and are not construed to indicate or imply relative importance. Unless expressly limited otherwise, the term "a plurality of" refers to two or more.

Similarly, the terms "one" or "a" and the like do not indicate the numerical limitation, but indicate the existence of at least one.

The terms "comprise" or "include" and the like are used to indicate that the element or object preceding the terms "comprise" or "include" covers the element or object following the terms"comprise" or "include" and its equivalents, and shall not be understood as excluding other elements or objects.

The terms "on," "under," "left" and "right" are only used to indicate the relative positional relationship. When the absolute position of the described object changes, the relative positional relationship may change accordingly. The terms "connect" or "contact" and the like refer to electrical connections.

The term "and/or" may indicate three relationships. For example, A and/or B may indicate: A alone, A and B, and B clone. The symbol "/" generally indicates that the associated objects are in an "or" relationship.

Described above are example embodiments of the present disclosure, and are not intended to limit the present disclosure. Any modifications, equivalent replacements, improvements and the like made within the spirit and principles of the present disclosure should be included within the scope of protection of the present disclosure.

The invention claimed is:

1. A display panel, comprising:
   a substrate;
   a plurality of pixels, disposed on a side of the substrate, wherein each of the plurality of pixels comprises a plurality of sub-pixels of different colors;
   a pixel definition layer, disposed on the side of the substrate, wherein the pixel definition layer comprises a plurality of first openings sequentially arranged in a first direction and a plurality of second openings disposed within the plurality of first openings and sequentially arranged in a second direction, adjacent sub-pixels of a same color are disposed within a same first opening, adjacent sub-pixels of different colors are disposed within different first openings, and different sub-pixels in the adjacent sub-pixels of the same color are disposed within different second openings, the second direction being intersected with the first direction; and
   a drainage layer, disposed on a side, distal from the substrate, of the pixel definition layer, wherein the drainage layer comprises a plurality of drainage portions spaced apart from each other, an orthogonal projection of each of the plurality of drainage portions on the substrate being overlapped with an orthogonal projection of the first opening on the substrate and being not overlapped with an orthogonal projection of the second opening on the substrate, wherein each of the plurality of drainage portions comprises a plurality of drainage lines sequentially arranged in the first direction, one ends, distal from a target edge of the substrate, of the plurality of drainage lines are contacted to form a closed end of each of the plurality of drainage portions, and the other ends, proximal to the target edge of the substrate, of the plurality of drainage lines are spaced apart to form an open end of each of the plurality of drainage portions, the target edge being more proximal to the drainage portion relative to the other edges of the substrate.

2. The display panel according to claim 1, wherein the pixel definition layer comprises: a first pixel definition layer and a second pixel definition layer that are disposed on the side of the substrate, wherein the first pixel definition layer comprises the plurality of first openings sequentially arranged in the first direction, the second pixel definition layer is disposed within the plurality of first openings and comprises the plurality of second openings sequentially arranged in the second direction, and the orthogonal projection of each of the plurality of drainage portions on the substrate is within an orthogonal projection of the second pixel definition layer on the substrate.

3. The display panel according to claim 2, wherein an overlapping region between the orthogonal projection of the second pixel definition layer on the substrate and the orthogonal projection of each of the plurality of drainage portions on the substrate is trapezoidal-shaped, and the orthogonal projection of each of the plurality of drainage portions on the substrate is trapezoidal-shaped.

4. The display panel according to claim 2, wherein a thickness of the first pixel definition layer is greater than a thickness of the second pixel definition layer;

a material of a side, distal from the substrate, of the first pixel definition layer comprises a lyophobic material, and a material of the second pixel definition layer comprises a lyophilic material; and the sub-pixel comprises a pixel electrode, wherein in the second direction, the orthogonal projection of the second pixel definition layer on the substrate covers an orthogonal projection of an edge of the pixel electrode on the substrate.

5. The display panel according to claim 1, wherein the substrate is rectangular-shaped and comprises a first sub-region and a second sub-region symmetrically arranged in a central axis, the central axis extending in the first direction; wherein in the plurality of drainage portions disposed within the first sub-region, the closed end of each of the plurality of drainage portions faces towards the second sub-region, and the open end of each of the plurality of drainage portions is distal from the second sub-region; and in the plurality of drainage portions disposed within the second sub-region, the closed end of each of the plurality of drainage portions faces towards the first sub-region, and the open end of each of the plurality of drainage portions is distal from the first sub-region.

6. The display panel according to claim 1, wherein a cross section of the drainage line is I-shaped, and is perpendicular to the substrate.

7. The display panel according to claim 1, wherein a thickness of the drainage line is greater than or equal to 0.3 μm.

8. The display panel according to claim 1, wherein in the plurality of drainage lines in the drainage portion, an included angle between each two adjacent drainage lines is positively correlated with a line width of a side, distal from the substrate, of the drainage line.

9. The display panel according to claim 8, wherein the included angle Φ between each two adjacent drainage lines meets: Φ<0.12D+0.3, wherein D is the line width of the side, distal from the substrate, of the drainage line.

10. The display panel according to claim 9, wherein the included angle between each two adjacent drainage lines ranges from 0.1° to 2°.

11. The display panel according to claim 9, wherein the line width of the side, distal from the substrate, of the drainage line ranges from 2 μm to 20 μm.

12. The display panel according to claim 1, wherein the drainage portion includes 5 to 50 drainage lines.

13. The display panel according to claim 1, wherein a material of the drainage line comprises at least one of titanium, aluminum, and a titanium-aluminum alloy; or a material of the drainage line comprises an indium tin oxide.

14. A method for manufacturing a display panel, applicable to manufacturing the display panel as defined in claim 1, the method comprising:

providing a substrate;

forming a plurality of pixels on a side of the substrate, wherein each of the plurality of pixels comprises a plurality of sub-pixels of different colors;

forming a pixel definition layer on the side of the substrate, wherein the pixel definition layer comprises a plurality of first openings sequentially arranged in a first direction and a plurality of second openings disposed within the plurality of first openings and sequentially arranged in a second direction, adjacent sub-pixels of a same color are disposed within a same first opening, adjacent sub-pixels of different colors are disposed within different first openings, and different sub-pixels in the adjacent sub-pixels of the same color are disposed within different second openings, the second direction being intersected with the first direction; and forming a drainage layer on a side, distal from the substrate, of the pixel definition layer, wherein the drainage layer comprises a plurality of drainage portions spaced apart from each other, an orthogonal projection of each of the plurality of drainage portions on the substrate being overlapped with an orthogonal projection of the first opening on the substrate and being not overlapped with an orthogonal projection of the second opening on the substrate, wherein each of the plurality of drainage portions comprises a plurality of drainage lines sequentially arranged in the first direction, one ends, distal from a target edge of the substrate, of the plurality of drainage lines are contacted to form a closed end of each of the plurality of drainage portions, and the other ends, proximal to the target edge of the substrate, of the plurality of drainage lines are spaced apart to form an open end of each of the plurality of drainage portions, the target edge being more proximal to the drainage portion relative to the other edges of the substrate.

15. A display device, comprises: a power supply assembly, and a display panel; wherein the power supply assembly is connected to the display panel, and is configured to supply power to the display panel; and the display panel comprises:

a substrate;

a plurality of pixels, disposed on a side of the substrate, wherein each of the plurality of pixels comprises a plurality of sub-pixels of different colors;

a pixel definition layer, disposed on the side of the substrate, wherein the pixel definition layer comprises a plurality of first openings sequentially arranged in a first direction and a plurality of second openings disposed within the plurality of first openings and sequentially arranged in a second direction, adjacent sub-pixels of a same color are disposed within a same first opening, adjacent sub-pixels of different colors are disposed within different first openings, and different sub-pixels in the adjacent sub-pixels of the same color are disposed within different second openings, the second direction being intersected with the first direction; and a drainage layer, disposed on a side, distal from the substrate, of the pixel definition layer, wherein the drainage layer comprises a plurality of drainage portions spaced apart from each other, an orthogonal projection of each of the plurality of drainage portions on the substrate being overlapped with an orthogonal projection of the first opening on the substrate and being not overlapped with an orthogonal projection of the second opening on the substrate, wherein each of the plurality of drainage portions comprises a plurality of drainage lines sequentially arranged in the first direction, one ends, distal from a target edge of the substrate, of the plurality of drainage lines are contacted to form a closed end of each of the plurality of drainage portions, and the other ends, proximal to the target edge of the substrate, of the plurality of drainage lines are spaced apart to form an open end of each of the plurality of drainage portions, the target edge being more proximal to the drainage portion relative to the other edges of the substrate.

16. The display device according to claim 15, wherein the pixel definition layer comprises: a first pixel definition layer and a second pixel definition layer that are disposed on the side of the substrate, wherein the first pixel definition layer comprises the plurality of first openings sequentially arranged in the first direction, the second pixel definition layer is disposed within the plurality of first openings and comprises the plurality of second openings sequentially arranged in the second direction, and the orthogonal projection of each of the plurality of drainage portions on the substrate is within an orthogonal projection of the second pixel definition layer on the substrate.

17. The display device according to claim 16, wherein an overlapping region between the orthogonal projection of the second pixel definition layer on the substrate and the orthogonal projection of each of the plurality of drainage portions on the substrate is trapezoidal-shaped, and the orthogonal projection of each of the plurality of drainage portions on the substrate is trapezoidal-shaped.

18. The display device according to claim 16, wherein
a thickness of the first pixel definition layer is greater than a thickness of the second pixel definition layer;
a material of a side, distal from the substrate, of the first pixel definition layer comprises a lyophobic material, and a material of the second pixel definition layer comprises a lyophilic material; and
the sub-pixel comprises a pixel electrode, wherein in the second direction, the orthogonal projection of the second pixel definition layer on the substrate covers an orthogonal projection of an edge of the pixel electrode on the substrate.

19. The display device according to claim 15, wherein the substrate is rectangular-shaped and comprises a first sub-region and a second sub-region symmetrically arranged in a central axis, the central axis extending in the first direction; wherein
in the plurality of drainage portions disposed within the first sub-region, the closed end of each of the plurality of drainage portions faces towards the second sub-region, and the open end of each of the plurality of drainage portions is distal from the second sub-region; and
in the plurality of drainage portions disposed within the second sub-region, the closed end of each of the plurality of drainage portions faces towards the first sub-region, and the open end of each of the plurality of drainage portions is distal from the first sub-region.

20. The display device according to claim 15, wherein a cross section of the drainage line is I-shaped, and is perpendicular to the substrate.

* * * * *